United States Patent
Lee et al.

(10) Patent No.: US 7,751,249 B2
(45) Date of Patent: Jul. 6, 2010

(54) MINIMIZING POWER NOISE DURING SENSING IN MEMORY DEVICE

(75) Inventors: Seungpil Lee, San Ramon, CA (US); Hao Thai Nguyen, San Jose, CA (US); Man Lung Mui, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 115 days.

(21) Appl. No.: 12/163,115

(22) Filed: Jun. 27, 2008

(65) Prior Publication Data

US 2009/0323420 A1 Dec. 31, 2009

(51) Int. Cl.
*G11C 16/26* (2006.01)

(52) U.S. Cl. ............... 365/185.21; 365/185.22; 365/185.25; 365/185.17

(58) Field of Classification Search ............ 365/185.21, 365/185.22, 185.25, 185.17, 185.33
See application file for complete search history.

(56) References Cited

U.S. PATENT DOCUMENTS

| | | | |
|---|---|---|---|
| 5,220,221 A | 6/1993 | Casper | |
| 5,386,422 A | 1/1995 | Endoh et al. | |
| 5,418,482 A | 5/1995 | Wong et al. | |
| 5,570,315 A | 10/1996 | Tanaka et al. | |
| 5,646,899 A | 7/1997 | Jang et al. | |
| 5,774,397 A | 6/1998 | Endoh et al. | |
| 5,999,454 A | 12/1999 | Smith | |
| 6,046,935 A | 4/2000 | Takeuchi et al. | |
| 6,205,068 B1 * | 3/2001 | Yoon | 365/203 |
| 6,337,823 B1 | 1/2002 | Seo et al. | |
| 6,366,513 B1 | 4/2002 | Wang | |
| 6,456,528 B1 | 9/2002 | Chen | |
| 6,490,199 B2 | 12/2002 | Lee et al. | |
| 6,522,580 B2 | 2/2003 | Chen et al. | |
| 6,859,397 B2 | 2/2005 | Lutze et al. | |
| 6,917,542 B2 | 7/2005 | Chen et al. | |
| 7,130,233 B2 * | 10/2006 | Huang | 365/203 |
| 7,327,619 B2 | 2/2008 | Chan et al. | |
| 7,495,961 B2 * | 2/2009 | Cho et al. | 365/185.21 |
| 2006/0221693 A1 | 10/2006 | Cernea et al. | |

* cited by examiner

*Primary Examiner*—Andrew Q Tran
(74) *Attorney, Agent, or Firm*—Vierra Magen Marcus & DeNiro LLP

(57) ABSTRACT

In a sensing method, accuracy of sensing operations, such as read or verify, in a memory device is improved by avoiding fluctuations in a sense amp supply voltage which can occur when different sense amps are strobed at different times. First and second sets of sense amps perform a sensing operation on respective storage elements, such as in an all bit line configuration. The first set of sense amps is strobed at a first time point. In response, a sensed analog level is converted to digital data. The A/D conversion relies on the sense amp supply voltage being accurate. To avoid a fluctuation in the sense amp supply voltage, a bypass path allows the storage elements associated with the first set of sense amps to continue to draw power from the sense amp supply voltage. The second set of sense amps is strobed at a later, second time point.

21 Claims, 10 Drawing Sheets

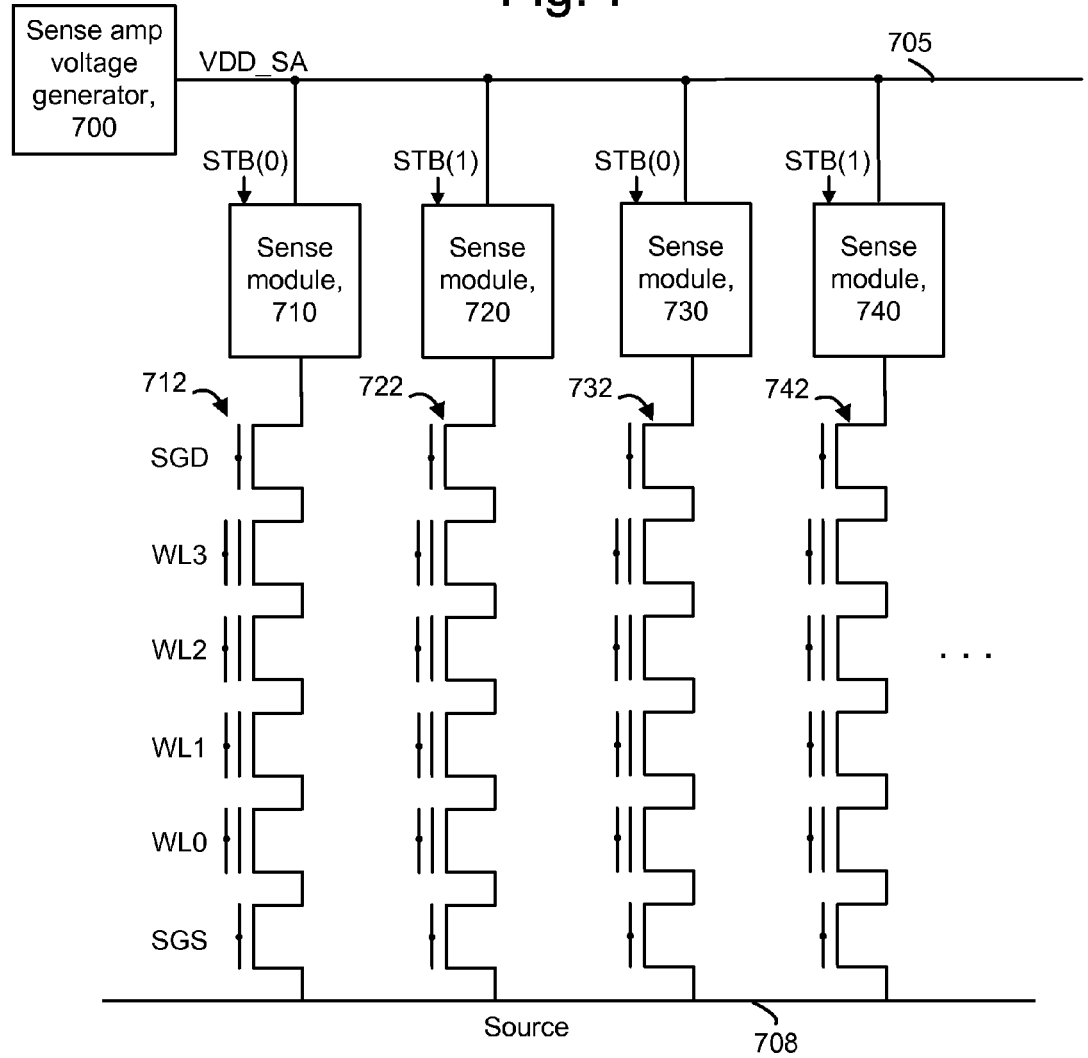

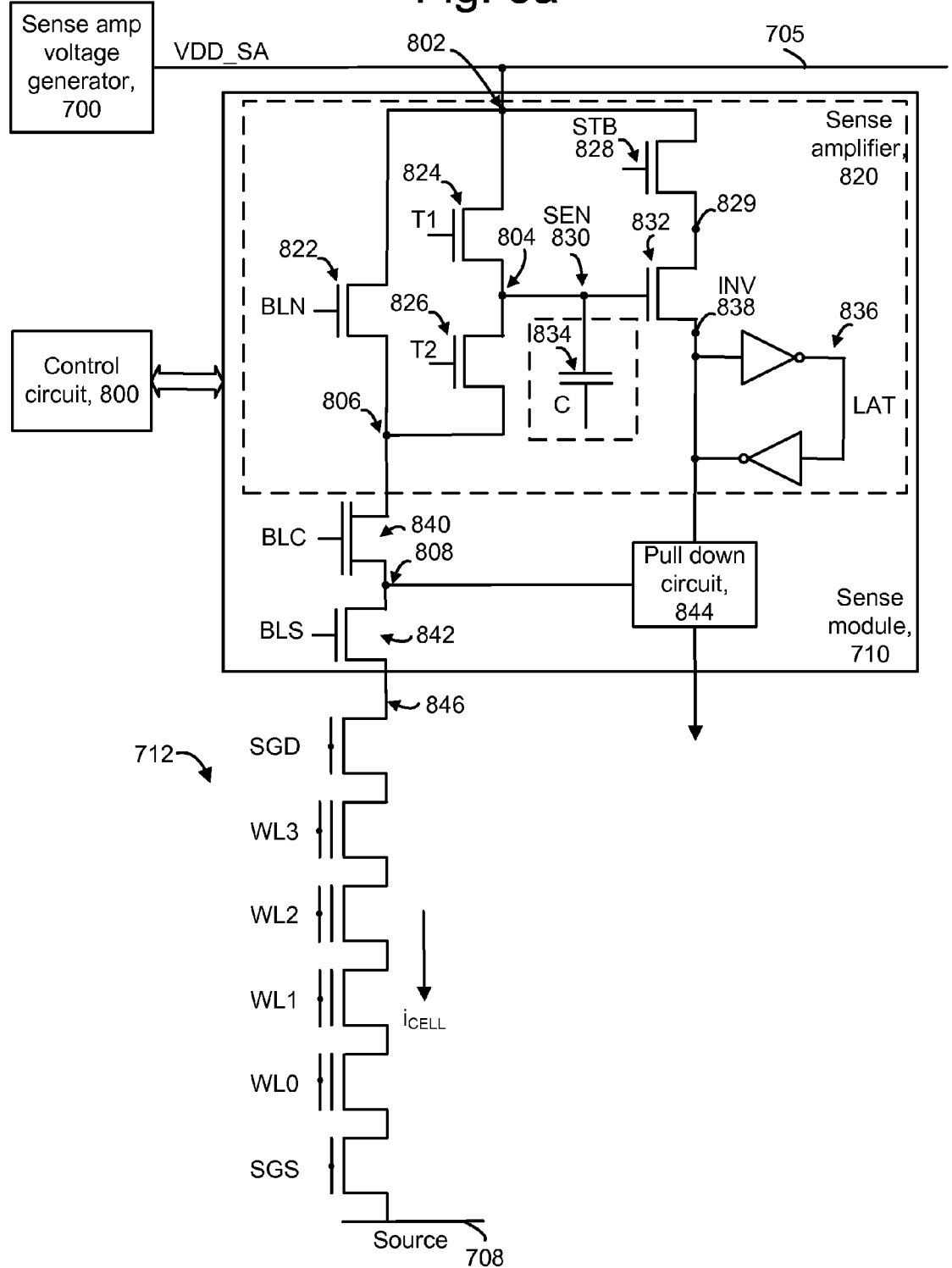

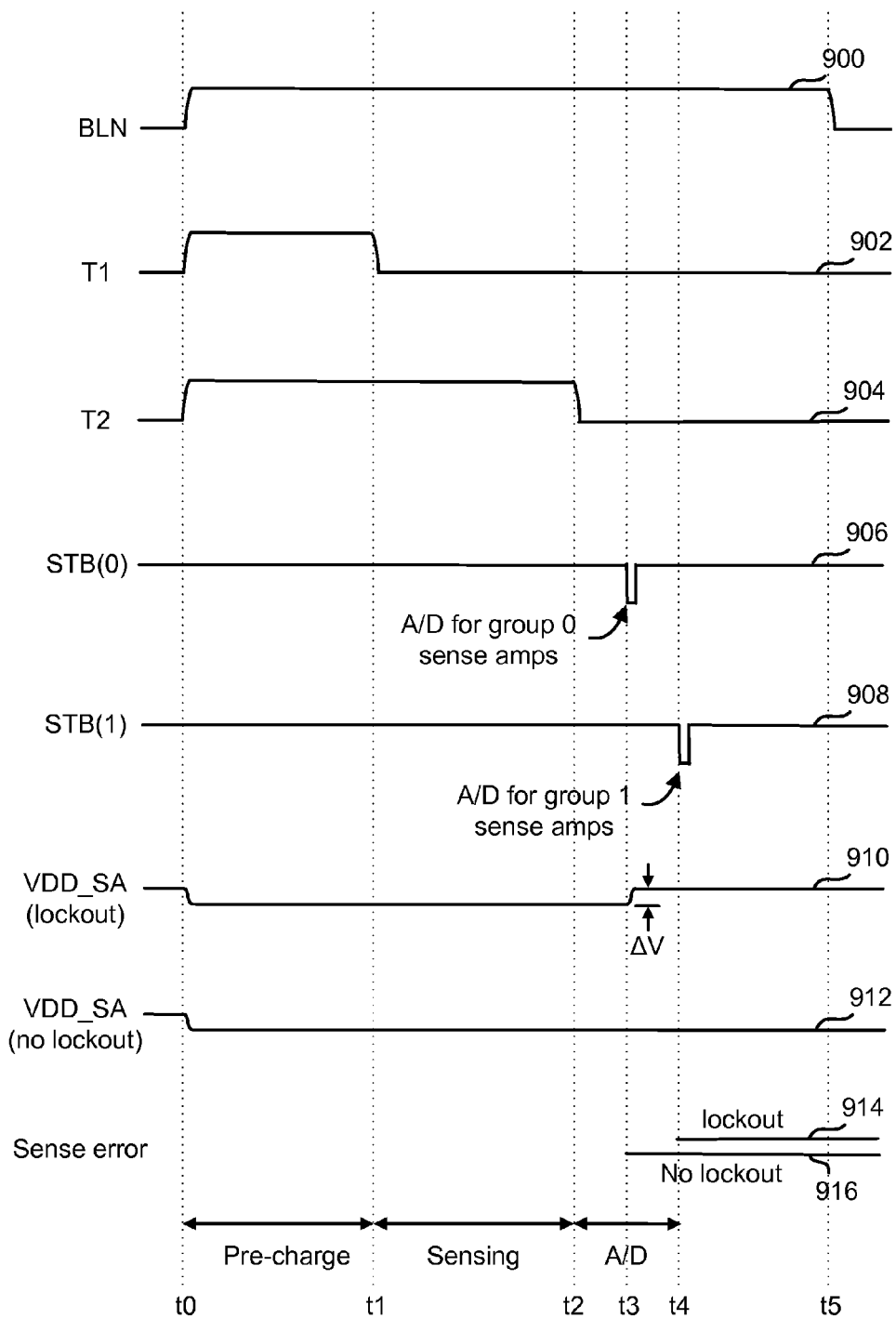

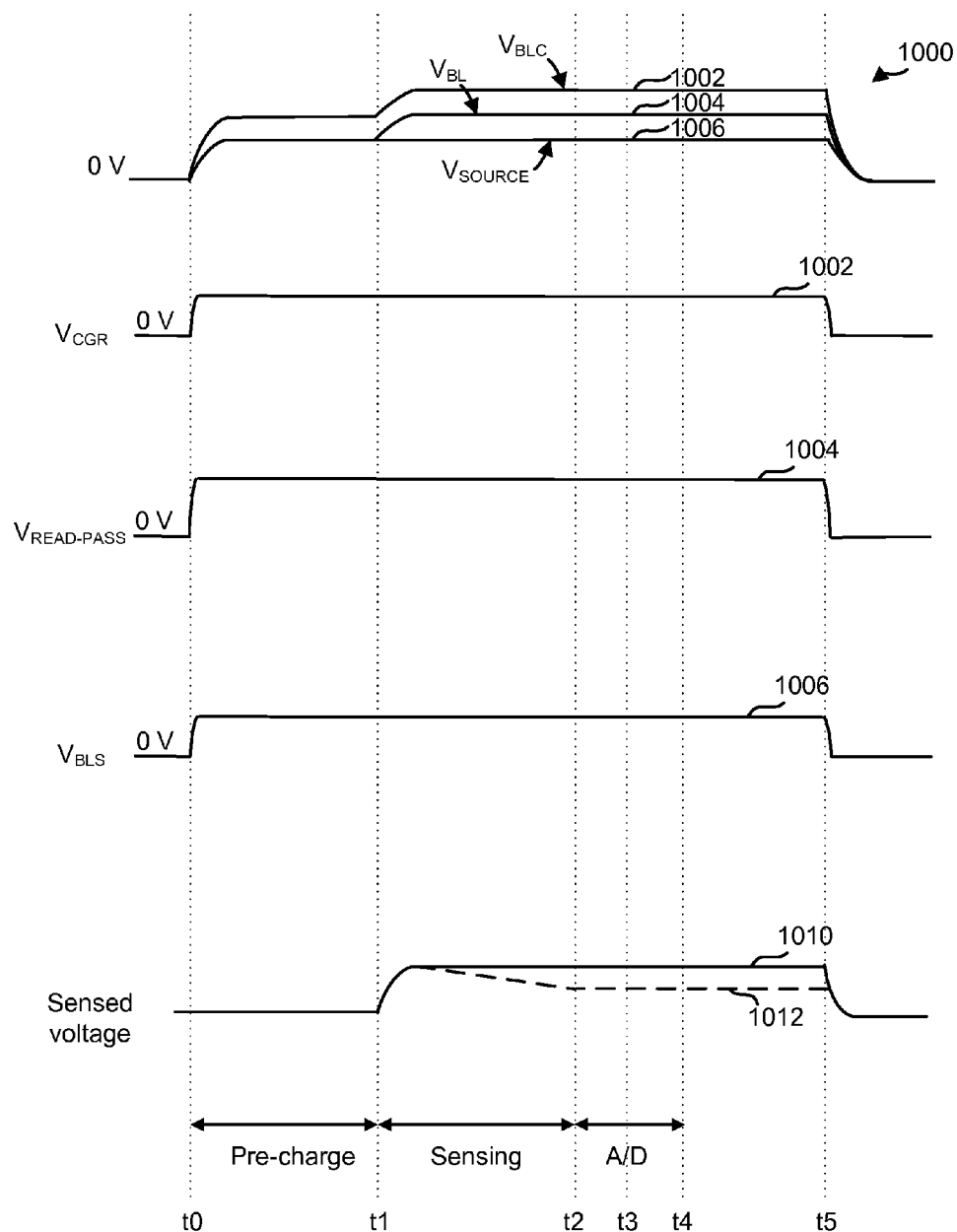

MINIMIZING POWER NOISE DURING SENSING IN MEMORY DEVICE

CROSS-REFERENCE TO RELATED APPLICATIONS

This application is related to co-pending, commonly-assigned U.S. patent application Ser. No. 12/163,133, titled "Memory Device With Power Noise Minimization During Sensing", filed herewith, and incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

When programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. Nos. 6,859,397 and 6,917,542, both of which are incorporated herein by reference in their entirety.

During sensing operations, such as read or verify operations, the programmed state of the storage elements is determined. For example, in a NAND flash memory device, the state of one or more storage elements can be determined using a sense module which is coupled to the NAND string via a bit line. However, the sensing process is subject to various error sources. Techniques are needed to reduce sensing inaccuracies and to thereby allow tighter threshold distributions.

SUMMARY OF THE INVENTION

The present invention relates to a sensing method for a memory device in which storage elements are sensed with increased accuracy by reducing the effects of sense amplifier supply power noise.

In one embodiment, a method of controlling a sense module in a storage system includes coupling a power supply to at least one storage element via a first conductive path, coupling a sense node to the at least one storage element via a second conductive path which differs at least in part from the first conductive path, and converting an analog level at the sense node to digital data based on a level of the power supply. When the analog-to-digital converter converts the analog level at the sense node to the digital data, the method further includes coupling the power supply to the at least one storage element via a third conductive path which differs at least in part from the first and second conductive paths.

In another embodiment, a method of controlling a set of sense modules in a storage system includes providing a common power supply to at least first and second sense modules, coupling a first sense node in the first sense module to at least a first storage element to sense a condition of the at least a first storage element, and converting an analog level at the first sense node to first digital data at a first time based on a level of the common power supply. The method further includes coupling a second sense node in the second sense module to at least a second storage element to sense a condition of the at least a second storage element, and converting an analog level at the second sense node to second digital data at a second time which is after the first time based on a level of the common power supply, and coupling the common power supply to the first storage element during a time period which includes the second time, while decoupling the first sense node from the at least a first storage element during the time period.

In another embodiment, a method is provided for of controlling a storage system which includes storage elements and associated sense modules, including a first set of storage elements and an associated first set of sense modules, and a second set of storage elements and an associated second set of sense modules. The method includes coupling a common power supply to the associated sense modules. The method further includes instructing the first set of sense modules to provide, based on a level of the common power supply, and at a first time in a first time period, digital data which is indicative of respective states of the first set of storage elements, and to couple the common power supply to the first set of storage elements during the first time period. the method further includes instructing the second set of sense modules to provide, based on the level of the common power supply, and at a second time in the first time period which is after the first time, digital data which is indicative of respective states of the second set of storage elements.

Corresponding operating methods, apparatuses, and computer- or processor-readable storage media which provide code which is executed to perform such methods, may be provided.

BRIEF DESCRIPTION OF THE DRAWINGS

FIG. 7 depicts different sets of sense modules in communication with respective sets of storage elements.

FIG. 8a depicts a sense module.

FIG. 8b depicts conductive paths in the sense module of FIG. 8a.

FIG. 9 depicts waveforms associated with a sensing operation.

FIG. 10 depicts waveforms associated with FIG. 9.

DETAILED DESCRIPTION

The present invention relates to a sensing method for a memory device in which storage elements are sensed with increased accuracy by reducing the effects of sense amplifier supply power noise.

Figure 1:
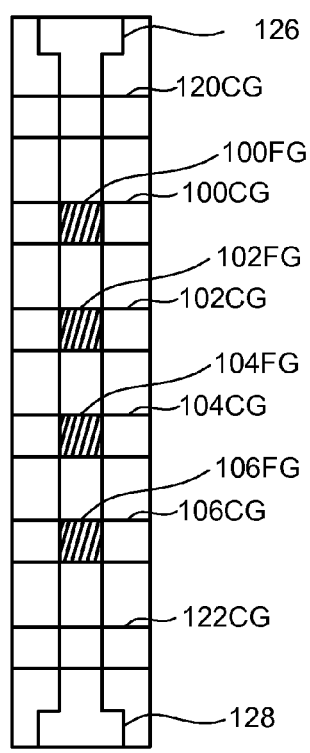
FIG. 1 is a top view of a NAND string.
Figure 2:
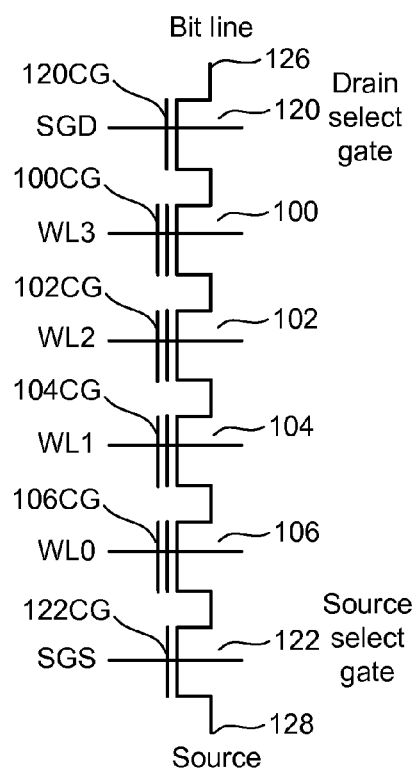
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
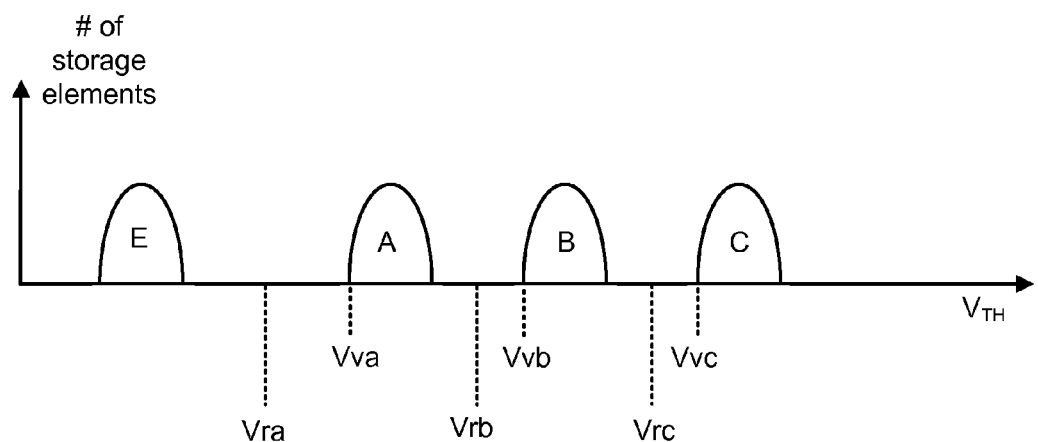
FIG. 3 depicts an example set of threshold voltage distributions.

FIG. 3 depicts an example set of threshold voltage distributions. An example $V_{TH}$ distribution for the storage element array is provided for a case where each storage element stores two bits of data using four data states or distributions. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more than four states, e.g., eight or sixteen states, or fewer than four states, e.g., two states.

Three read reference voltages, Vra, Vrb and Vrc, are also provided for reading data from the storage elements. By testing whether the threshold voltage of a given storage element is above or below Vra, Vrb and Vrc, the system can determine the state, e.g., programming condition, the storage element is in. This occurs in a sensing operation.

Further, three verify reference voltages, Vva, Vvb and Vvc, are provided. Additional read and reference values can be used when the storage elements store additional states. When programming storage elements to state A, B or C, the system will test whether those storage elements have a threshold voltage greater than or equal to Vva, Vvb or Vvc, respectively. This also occurs in a sensing operation.

Figure 4:
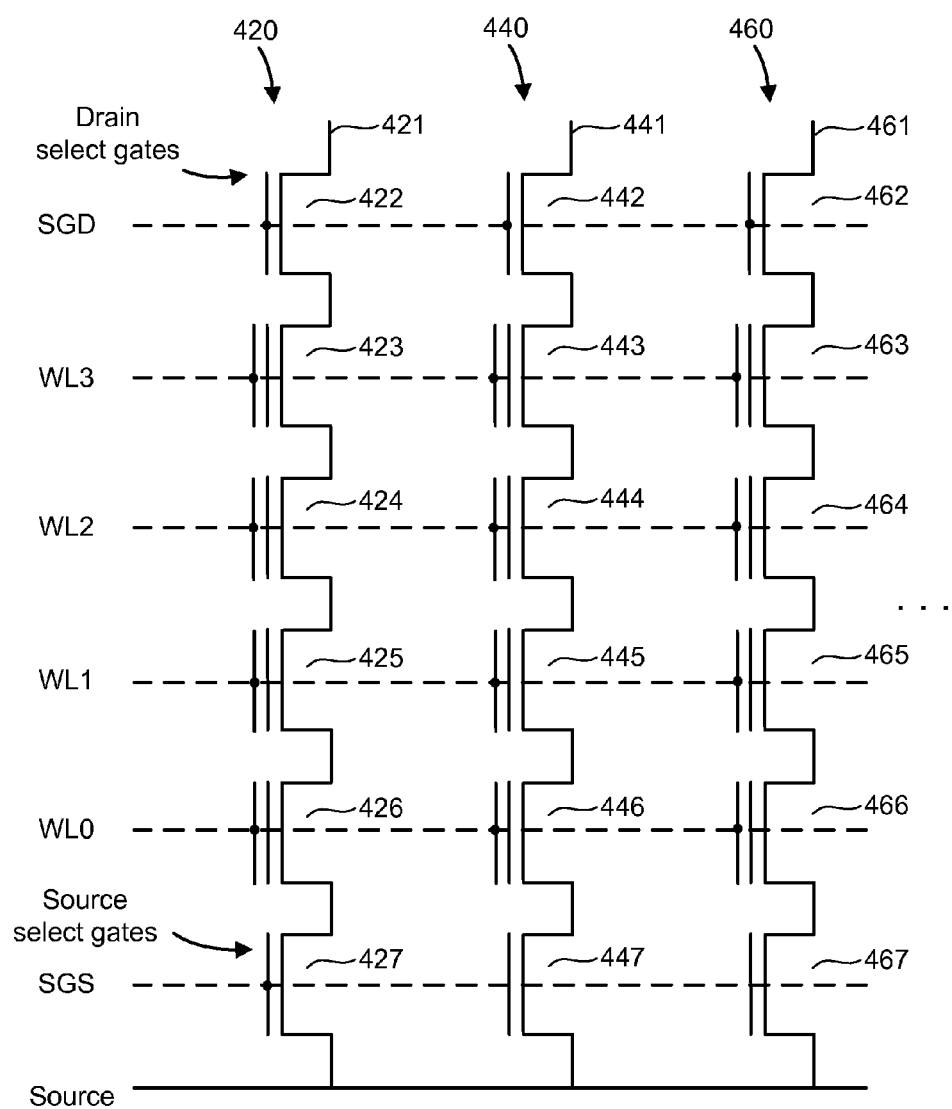
FIG. 4 is a block diagram of an array of NAND flash storage elements.

Various types of programming techniques have been developed, including single-pass and multiple-pass techniques. In an example single pass technique, known as full sequence programming, storage elements can be programmed from the erase state E directly to any of the programmed states A, B or C. For example, a population of storage elements to be programmed may first be erased so that all storage elements in the population are in erased state E. A series of programming pulses will then be used to program storage elements directly into states A, B or C. While some storage elements are being programmed from state E to state A, other storage elements are being programmed from state E to state B and/or from state E to state C. In an example multi-pass technique, storage elements which are intended to be programmed to higher states may be programmed part way in a first pass, and the rest of the way in a second pass. Storage elements which are intended to be programmed to lower states may be programmed al the way in the first or second pass FIG. 4 is a circuit diagram depicting three NAND strings. A typical architecture for a flash memory system using a NAND structure will include several NAND strings or chains. For example, three NAND strings 420, 440 and 460 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 420 includes select gates 422 and 427, and storage elements 423-426, NAND string 440 includes select gates 442 and 447, and storage elements 443-446, NAND string 460 includes select gates 462 and 467, and storage elements 463-466. Each NAND string is connected to the source line by its select gates (e.g., select gates 427, 447 or 467). A selection line SGS is used to control the source side select gates. The various NAND strings 420, 440 and 460 are connected to respective bit lines 421, 441 and 461, by select transistors in the select gates 422, 442, 462, etc. These select transistors are controlled by a drain select line SGD. In other embodiments, the select lines do not necessarily need to be in common among the NAND strings; that is, different select lines can be provided for different NAND strings. The word lines are connected to respective control gates of storage elements as depicted. Each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 424, 444 and 464. In practice, there can be thousands of storage elements on a word line.

Each storage element can store data in respective data states as discussed in connection with FIG. 3. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on (become conductive) to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ values is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00."

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 424 of FIG. 4, the program voltage will also be applied to the control gates of storage elements 444 and 464.

The NAND strings 420, 440 and 460 may be formed on a substrate which employs a triple-well technology which includes a p-well region within an n-well region, which in turn is within a p-type substrate region. The NAND string and its non-volatile storage elements can be formed, at least in part, on the p-well region.

Figure 5:
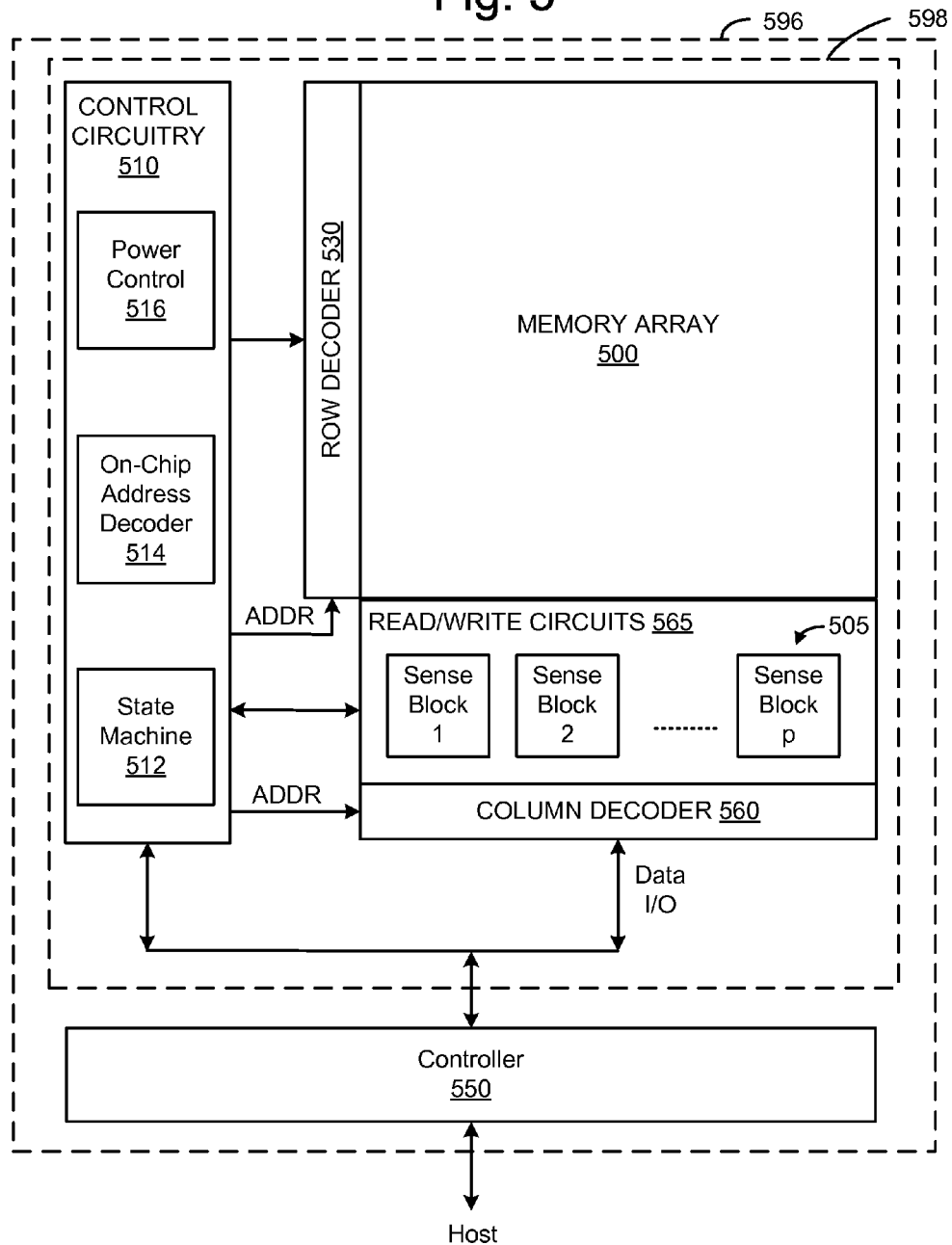
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment of the present invention. Memory device 596 may include one or more memory die 598. Memory die 598 includes a two-dimensional array of storage elements 500, control circuitry 510, and read/write circuits 565. In some embodiments, the array of storage elements can be three dimensional. The memory array 500 is addressable by word lines via a row decoder 530 and by bit lines via a column decoder 560. The read/write circuits 565 include multiple sense blocks 505 and allow a page of storage elements to be read or programmed in parallel. Typically a controller 550 is included in the same memory device 596 (e.g., a removable storage card) as the one or more memory die 598. Commands and Data are transferred between the host and controller 550 and between the controller and the one or more memory die 598.

The control circuitry 510 cooperates with the read/write circuits 565 to perform memory operations on the memory array 500. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 500, can be thought of as a managing or control circuit. For example, one or more managing or control circuits may include any one of or a combination of control circuitry 510, state machine 512, decoders 514/560, power control 516, sense blocks 500, read/write circuits 565, controller 550, and so forth.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

Figure 6:
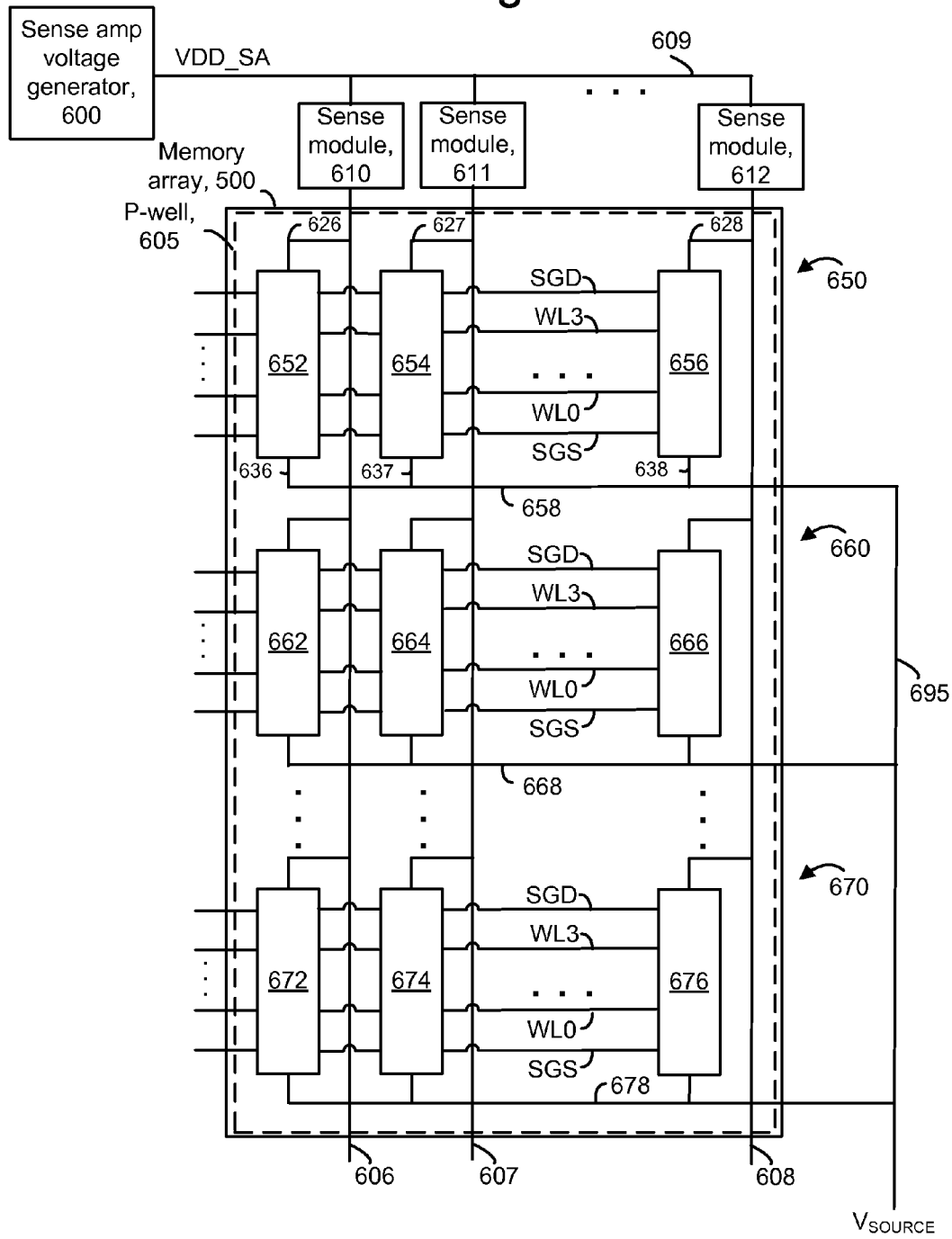
FIG. 6 depicts an example of an array of storage elements, including different sets of NAND strings.

FIG. 6 depicts an example of an array of storage elements, including different sets of NAND strings. In a p-well 605 of a memory array 500, a first set 650 of NAND strings includes NAND strings 652, 654, . . . , 656, and an associated source line 658, a second set 660 of NAND strings includes NAND strings 662, 664, . . . , 666, and an associated source line 668, and a third set 670 of NAND strings includes NAND strings 672, 674, . . . , 676, and an associated source line 678. Further, along each column of the memory array 500, a bit line 606, 607, . . . , 608 is coupled to the drain terminal 626, 627, . . . , 628, of the drain select gate for the associated set of NAND strings 652, 654, . . . , 656, respectively. Along each row of NAND strings, the source line may connect all the source terminals of the source select gates of the NAND strings. For example, for the first set 650 of NAND strings, the source line 658 connects the source terminals 636, 637, . . . , 638 of the source select gates of the sets of NAND strings 652, 654, . . . , 656, respectively.

Further, sense modules 610, 611 and 612, are associated with the bit lines 606, 607 and 608, respectively. A sense amp voltage generator 600 is coupled to the sense modules 610, 611 and 612 via a conductive path 609 which allows the sense modules to operate.

In this approach, a common bit line and sense module are associated with different sets of NAND strings or other sets of non-volatile storage elements. For example, sense module 610 is associated with NAND strings 652, 662 and 672. Various other implementations are possible as well. For example, a sense block can be shared by multiple NAND strings in a common set of NAND strings. Or, each NAND string in the memory array 500 can have its own sense block.

General examples of a NAND architecture array and its operation as part of a memory system are found in U.S. Pat. Nos. 5,570,315, 5,774,397, and 6,046,935, incorporated herein by reference. An array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

FIG. 7 depicts different sets of sense modules in communication with respective sets of storage elements. A sense amp voltage generator 700 is coupled to different sets of series-connected storage elements 712, 722, 732 and 742 via a conductive path 705 and respective different sense modules 710, 720, 730 and 740. One example of a set of series-connected storage elements is a NAND string. However the techniques described herein are suitable for sensing any set of one or more storage elements. The sense modules are in a common set when they receive a common strobe signal, which initiates an A/D conversion in the sense modules. In this example, there are two sets, although in practice there may be more, e.g., four sets. The strobe is thus skewed or delayed among different sets of storage elements. Specifically, sense modules 710 and 730 are in a first set because they both receive a strobe signal STB(0) at a first specified time, and sense modules 720 and 740 are in a second set because they both receive a strobe signal STB(1) at a second specified time which is different than the first specified time. Additional sense modules and sets of storage elements are typically present but are not shown. The respective sets of series-connected storage elements 712, 722, 732 and 742 are also coupled to a source line 708. Note also that one sense module may be provided for each set of series-connected storage elements, or one sense module may be shared by multiple sets of series-connected storage elements in a time multiplexed manner.

In the approach of FIG. 7, sensing can be performed concurrently for multiple storage elements which are associated with a common word line. The multiple storage elements may be in adjacent or non-adjacent NAND strings. For example, all bit line (ABL) sensing involves concurrent sensing of storage elements in adjacent NAND strings. In this case, the sensing includes determining, in concurrent sensing operations, whether each of the non-volatile storage elements is in the conductive or non-conductive state. Odd-even sensing involves, e.g., concurrent sensing of storage elements in odd-numbered NAND strings, followed by concurrent sensing of storage elements in even-numbered NAND strings.

FIG. 8a depicts a sense module. Further details of the example sense modules 710 of FIG. 7 are provided. A control circuit 800 is in communication with the sense module 710, such as to provide control signals to the various transistors/switches in the sense module. The sense module 710 includes a sense amplifier 820 for sensing whether a selected storage element in the NAND string 712 is in a conductive or non-conductive state when a read or verify voltage is applied to a control gate of the selected storage via a corresponding selected word line. The sense module communicates with the NAND string 712 via a bit line 846.

The sense amplifier 820 is coupled at an input node 802 to the conductive path 705 which carries VDD_SA, the sense amp supply voltage. Transistors T1 824 and T2 826 can be activated via control signals to selectively allow communication between the input node 802, a sense node (SEN) 830, and an output node 806 of the sense amplifier. A node 804 between the transistors 824 and 826 is coupled to the sense node 830. Further, a transistor (BLN) 822 can be activated via control signals to selectively allow communication between the input node 802 and the output node 806. The transistor (BLN) 822 thus provides a bypass which can be used to maintain communication of the input node 802 and the output node 806, so that VDD_SA is maintained at the output node 806. Additionally, a bit line clamp (BLC) transistor 840 and a bit line sense (BLS) transistor 842 can be controlled to selectively allow communication between the output node 806 and the bit line 846. The BLS transistor 842 is a high voltage transistor, and is made conductive during sense operations. The BLC transistor 840 is a low voltage transistor which is made conductive to allow the bit line to communicate with the sense amp 820. A pull down circuit 844 pulls the voltage of a node 808 to ground or a regulated $V_{SOURCE}$ or other regulated DC voltage, for instance, when a selected storage element is determined to be conductive, based on a value INV at node 838.

During a sensing operation, a pre-charge phase involves charging the bit line by allowing VDD_SA to communicate with the bit line. This can be achieved by making transistors 824, 826, 840 and 842 conductive, for instance. A charge storing element such as a capacitor C 834 may also be charged by VDD_SA in this manner. Note that VDD_SA will drop slightly from its regulated level due to a current drawn from each sense amp to the associated NAND chain (see FIG. 9, waveforms 910 or 912 at t0). A subsequent sensing phase involves discharging the capacitor C 834 to the bit line 846 via the sense node 830 and transistors 826, 840 and 842, so that an analog voltage level at the sense node 830 is set based on whether the selected storage element is conductive or non-conductive. If the selected storage element is conductive, a current $i_{CELL}$ will flow in the NAND string 712 and the capacitor 834 will discharge noticeably. If the selected storage element is non-conductive, no current or a very small current $i_{CELL}$ will flow in the NAND string 712 and the capacitor 834 will not discharge noticeably.

A subsequent analog-to-digital (A/D) conversion phase then takes place. When a strobe signal is received by a strobe (STB) transistor 828, the transistor 828 becomes conductive, allowing VDD_SA to pass to one input 829 of a comparison transistor 832. With the analog voltage level at the sense node 830 as another input of the comparison transistor 832, the output of the transistor 832 will provide digital data that is based on the condition of the selected storage element. The comparison transistor 832 may thus provide an analog-to-digital converter. For example, if $V_{SEN}>V_{TH}+VDD\_SA$, then the output of the comparison transistor 832 will be VDD_SA at node 838 (INV), which may denote a binary "0," for instance. This indicates the selected storage element is non-conductive. On the other hand, if $V_{SEN}<=V_{TH}+VDD\_SA$, then the output of the comparison transistor 832 will be about 0 V, which may denote a binary "1," for instance. This indicates the selected storage element is conductive. $V_{TH}$ is the threshold voltage of the comparison transistor 832. The output of the comparison transistor 832 is a value INV at node 838. The value is latched by a latch (LAT) 836, which is complementary to INV. INV is thus flipped from "0" to "1" when the selected storage element is conductive, causing the pull down circuit 844 to pull down the voltage at node 808.

Additional sensing operations can be performed as needed with different control gate voltages in order to ascertain the data state of the selected storage element. For example, with threshold voltage distribution of FIG. 3, sensing operations when reading may be performed with control gate voltages of Vra, Vrb and Vrc, and sensing operations when verifying may be performed with control gate voltages of Vva, Vvb and Vvc.

Figure 8B:
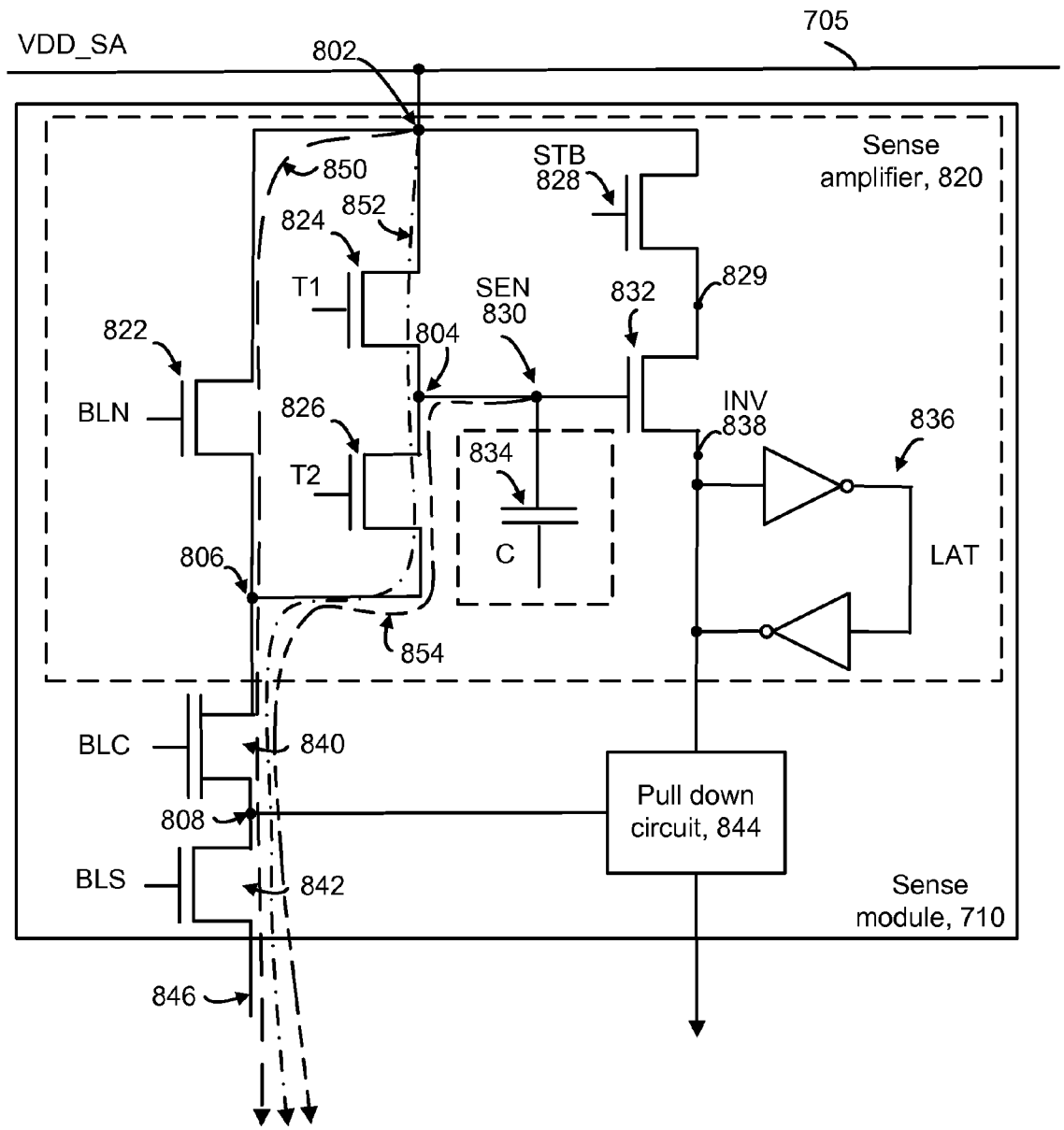

FIG. 8b depicts conductive paths in the sense module of FIG. 8a. The drawing provides an enlarged version of FIG. 8a for clarity. Conductive paths 850, 852 and 854 are depicted. During the pre-charge phase of the sensing operation, the conductive path 852 is enabled by controlling the corresponding transistors 824, 826, 840 and 842 to be conductive. During the sensing phase of the sensing operation, the conductive path 854 is enabled by controlling the corresponding transistors 824, 826, 840 and 842 to be conductive. Also, the conductive path 852 is terminated by controlling the transistor 824 to be non-conductive. During the A/D phase of the sensing operation, the conductive path 850 is enabled by controlling the corresponding transistors 822, 840 and 842 to be conductive. The conductive paths 852 and 854 are terminated by controlling the transistors 824 and 826 to be non-conductive.

The conductive path 850 provides a bypass which maintains VDD_SA in contact with the bit line 846 without affecting the level of the sense node 830 or the latched data (LAT). By maintaining VDD_SA in contact with the bit line 846, the current path from the sense amplifier to the storage element, and the associated power draw, P=I×V, is maintained. The total power draw in a memory device depends on how many storage elements are conductive. For example, when the storage elements are in NAND chains, the total power draw depends on how many NAND chains are conductive. The conductive path 850 also provides a bypass to the latch (LAT) so that its functioning is not affected.

If the power draw was not maintained, VDD_SA would bounce up or otherwise fluctuate on the conductive path 705, e.g., when the value INV is flipped from "0" to "1," indicating that the selected storage element is conductive. This undesirable fluctuation (see ΔV in waveform 910 in FIG. 9) is a type of sense amp power supply noise. This would affect other sense modules which have not yet receive a strobe signal and performed the A/D phase by changing the level which is input to the comparison transistor 832, reducing sensing accuracy and possibly causing sensing errors. That is, without the bypass conductive path, the sense module 710 would be in a lockout state in which communication between the conductive path 705 and the bit line 846 is prevented. This is a sensing lockout, not a programming lockout which occurs when programming of a storage element is completed. Note that the conductive path 850 can be made conductive during the pre-charge and/or sensing phases of the sense operation as well. By maintaining a conductive path through the storage elements in a NAND chain or other set of storage elements regardless of the latched information (LAT), the power draw is maintained, e.g., so that sensing accuracy is not impaired when later sets of sense amps are strobed. This is referred to as a no-lockout approach. Thus, sense amp power supply noise is reduced and sensing accuracy is improved. Advantageously, this can allow tighter threshold voltage distribution margins.

For example, referring also to FIG. 7, the level of VDD_SA which is seen by a particular sense module is based on the regulated value of VDD_SA less the voltage drop in each NAND chain which is between the particular sense module and the sense amp voltage generator. For example, during sensing, before any A/D conversion, the VDD_SA level seen by the sense module 740 can be expressed by: regulated level—V_NAND(1)–V_NAND(2)–V_NAND(3), where V_NAND(i) is the voltage drop in the ith NAND chain. With the problematic lockout approach, after STB(0) is applied, the voltage drops V_NAND(1) and V_NAND(3) are removed, so that the VDD_SA level seen by the sense module 740 increases to: regulated level—V_NAND(2). This increase is ΔV=V_NAND(1)+V_NAND(3). A problem thus occurs for sense module 740 and other sense modules which later receive the second strobe, STB(1). Those sense modules have not yet performed an A/D conversion, but the VDD_SA level which is used in the A/D conversion has moved. This can create errors for these A/D conversions. VDD_SA may be a few Volts in an example implementation.

Note that the specific circuit diagram provided is an example only as many alternatives approaches are available for coupling VDD_SA to the storage elements.

Referring still to FIG. 8b, in a specific implementation which uses all bit line sensing and current sensing, the pre-charged capacitor 834 in the sense amplifier 820 discharges through the bit line 846 and into the source 708 so that the source acts as a current sink. The capacitor 834 may be pre-charged to a potential which exceeds a potential of the source ($V_{SOURCE}$) so that the current $i_{CELL}$ flows through the selected non-volatile storage element and sinks into the source when the selected storage element is in the conductive state. In particular, if the selected storage element is in a conductive state due to the application of a sufficiently high control gate voltage, a relatively high current will flow. If the selected storage element is in a non-conductive state, no or relatively little current will flow. The sense amplifier 820 can sense the cell/storage element current, $i_{CELL}$. In one possible approach, the sense amplifier 820 determines a voltage drop which is tied to a fixed current flow by the relationship $\Delta V=i\cdot t/C$, where $\Delta V$ is the voltage drop, i is the fixed current, t is a predetermined discharge time period and C is the capacitance of the pre-charged capacitor. See also FIG. 11, which depicts a voltage drop with time for different lines of fixed current. The greater voltage drops represent higher currents. The time "t" denotes the end of a given discharge period.

Voltage sensing, in contrast, does not involve sensing a voltage drop which is tied to a fixed current. Instead, voltage sensing involves determining whether charge sharing occurs between the capacitor 834 and a capacitance of the bit line. Current is not fixed or constant during the sensing. Little or no charge sharing occurs when the selected storage element is conductive, in which case the voltage of the capacitor in the voltage sensing module does not drop significantly. Charge sharing does occur when the selected storage element is non-conductive, in which case the voltage of the capacitor in the voltage sensing module does drop significantly.

FIG. 9 depicts waveforms associated with a sensing operation. Note that the diagrams provided herein are not necessarily to scale. The x-axis denotes increasing time while the y-axis denotes amplitude. For waveforms 900, 902 and 904, a high amplitude denotes a transistor being made conductive, while a low amplitude denotes a transistor being made non-conductive. A sensing operation can include a pre-charge phase (t0-t1), a sensing phase (t1-t2) and an A/D conversion phase (t2-t4). In the pre-charge phase, transistors T1 and T2 are open (see also FIGS. 8a and 8b), as depicted by waveforms 902 and 904, respectively. The transistor BLN may optionally be open as well, as depicted by waveform 900, although it is not necessary until the A/D conversion phase. The strobe signals STB(0) and STB(1), depicted by waveforms 906 and 908, respectively, have not yet been set.

Waveform 910 depicts VDD_SA when a sense module is locked out so that the power draw of the sense module and associated storage elements is removed. Initially, when the sensing operation begins at t0, a current draw reduces VDD_SA slightly. This may include, e.g., a current draw from the sense amps to the associated NAND chains. When A/D conversion is performed for the sense modules associated with STB(0), at t3, the power draw on VDD_SA would be removed for the locked out sense modules, so that VDD_SA would bounce back up by an amount $\Delta V$. This can affect the sensing accuracy for the sense modules associated with other strobes such as STB(1). These other sense modules undergo the A/D process at a later time point (t4) since strobing all sense modules at the same time would cause excessive AC noise and a current peak. When the later A/D process is performed, at t4, the level of VDD_SA will be different, e.g., higher, than when the earlier A/D process was performed, at t3, resulting in sensing errors, since the A/D process depends on the level of VDD_SA. Further, as mentioned, more than two strobes may be used so that additional sets of sense amps undergo A/D conversion at additional delayed times.

In contrast, waveform 912 depicts VDD_SA when sense modules are not locked out so that the power draw of the sense modules and associated storage elements is maintained. VDD_SA thus remains essentially constant when A/D conversion is subsequently performed for the other sense modules which are associated with the other strobe signals such as STB(1), at t4, resulting in greater sensing accuracy and consistency. This benefit is reflected by the no lockout sense error waveform 916 which is reduced relative to the lockout sense error waveform 914. The process is completed at t5.

FIG. 10 depicts waveforms associated with FIG. 9. The time line on the x-axis is the same as that in FIG. 9. Waveforms 1002, 1004 and 1006 depict $V_{BLC}$, (the voltage applied to the BLC transistor 840 in FIG. 8a), $V_{BL}$ (the voltage on the bit line 846 in FIG. 8a) and $V_{SOURCE}$ (the voltage on the source 708 in FIG. 8a). $V_{SOURCE}$ is set at an elevated level at t0 at the start of the sense operation. $V_{BL}$ increases with $V_{SOURCE}$ between t0 and t1. At t1, the pre-charged capacitor is discharged in the sensing phase, increasing $V_{BL}$. Thus, a potential of a drain (e.g., $V_{BL}$) associated with the selected non-volatile storage element is above a potential of a source (e.g., $V_{SOURCE}$) associated with the selected non-volatile storage element. $V_{BLC}$ tracks $V_{BL}$ but is slightly higher due to the threshold voltage of the BLC transistor. In practice, after rising, $V_{BL}$ will drop slightly (not shown) if current flows in the NAND string. For example, $V_{BL}$ may rise to 1 V when $V_{BLC}$=2 V and the threshold voltage of the BLC transistor is 1 V. When sensing, if current flows, $V_{BL}$ may drop from 1 V to 0.9 V, for instance. Waveform 1002 depicts a control gate read voltage, $V_{CGR}$, which is the voltage applied to the selected word line. Waveform 1004 depicts a read pass voltage, $V_{READ-PASS}$, which is applied to the unselected word lines, in one possible approach. Waveform 1006 depicts $V_{BLS}$ (the voltage applied to the BLS transistor 842 in FIG. 8a), indicating it is conductive between t0 and t5.

Waveforms 1010 and 1012 depict a sensed voltage which is tied to a fixed current for the selected bit line. A determination can be made at the end of the sensing phase (t2) as to whether the voltage exceeds a demarcation level, e.g., based on VDD_SA. It can be concluded that the selected storage element is conductive when the voltage drops below the demarcation level (e.g., line 1012). The selected storage element is non-conductive if the voltage does not drop below the demarcation level (e.g., line 1010).

Figure 11:
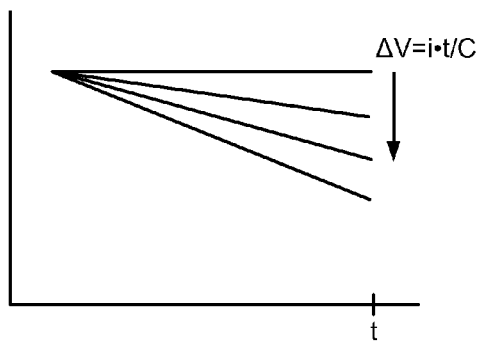
FIG. 11 depicts current sensing based on a change in voltage.

FIG. 11 depicts current sensing based on a change in voltage, as discussed previously in connection with FIGS. 8a and 8b.

Figure 12:
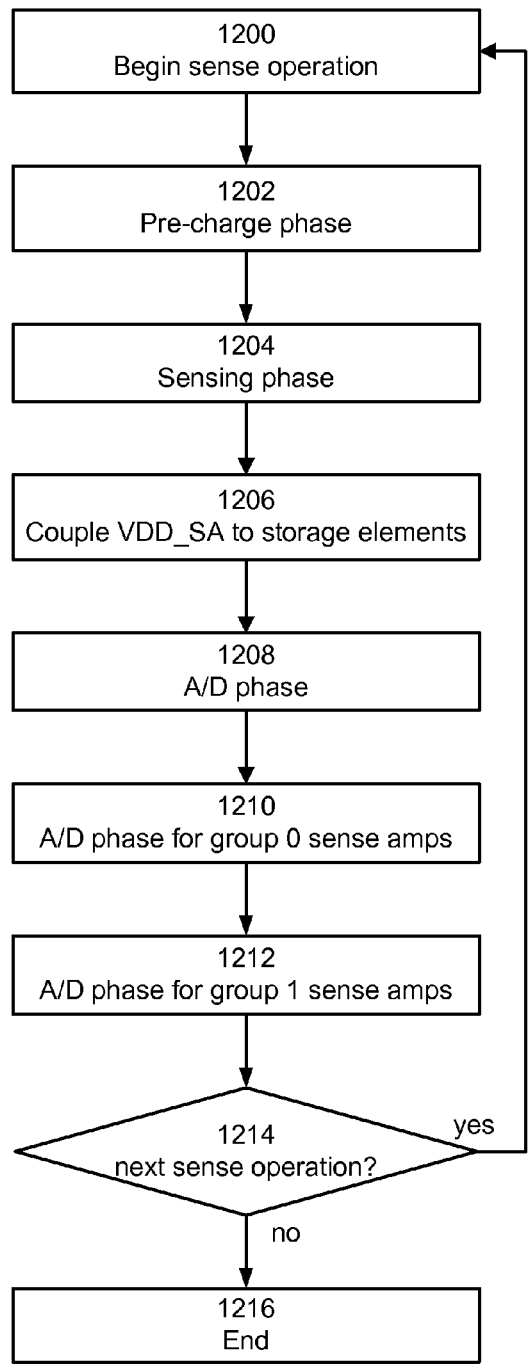
FIG. 12 depicts a sensing operation.

FIG. 12 depicts a sensing process. An overview of the sensing process is provided. The steps depicted do not necessary occur as discrete steps and/or in the sequence depicted. A sense operation, such as a read or verify operation, begins at step 1200. Step 1202 includes performing a pre-charge phase to pre-charge the bit line and capacitor. Step 1204 includes performing a sensing phase to obtain an analog voltage level at the sense node which indicates a condition of a selected storage element. Step 1206 includes coupling VDD_SA to the storage elements. Step 1208 includes performing an A/D phase. Step 1210 includes performing an A/D conversion for group 0 sense amps (sense amps which receive STB(0)). Step 1212 includes performing an A/D conversion for group 1 sense amps (sense amps which receive STB(1)). If there is a next sense operation at decision step 1214, the process begins again at step 1200. For example, a different control gate voltage of the selected storage element may be set in an additional sense operation. Multiple sensing operations can be performed successively, for example, one for each verify or read level. If there is no next sense operation, the process ends at step 1216.

Further, sensing can be performed concurrently for multiple storage elements which are associated with a common word line, e.g., using all bit line sensing or odd-even sensing, discussed previously.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of controlling a sense module in a storage system, comprising:
    coupling a power supply to at least one storage element via a first conductive path;
    coupling a sense node to the at least one storage element via a second conductive path which differs at least in part from the first conductive path;
    converting an analog level at the sense node to digital data based on a level of the power supply; and
    when the analog-to-digital converter converts the analog level at the sense node to the digital data, coupling the power supply to the at least one storage element via a third conductive path which differs at least in part from the first and second conductive paths.

2. The method of claim 1, further comprising:
    providing control signals to switches associated with the first, second and third conductive paths to cause: (a) the first conductive path to couple the power supply to the at least one storage element during a pre-charge phase of a sensing operation of the at least one storage element, (b) the second conductive path to couple the sense node to the at least one storage element during a sensing phase of the sensing operation which follows the pre-charge phase, (c) converting the analog level at the sense node to the digital data based on the level of the power supply during an analog-to-digital conversion phase of the sensing operation which follows the sensing phase, and (d) the third conductive path to couple the power supply to the at least one storage element during the analog-to-digital conversion phase.

3. The method of claim 2, further comprising:
    providing control signals to the switches to interrupt the first and second conductive paths so that they do not couple the power supply to the at least one storage element during the analog-to-digital conversion phase.

4. The method of claim 1, wherein:
    the at least one storage element is in a NAND string which is coupled to a bit line, and the first conductive path couples the power supply to the at least one storage element via the bit line.

5. The method of claim 1, wherein:
    the at least one storage element is connected in series in a set of storage elements.

6. A method of controlling a set of sense modules in a storage system, comprising:
    providing a common power supply to at least first and second sense modules;
    coupling a first sense node in the first sense module to at least a first storage element to sense a condition of the at least a first storage element, and converting an analog level at the first sense node to first digital data at a first time based on a level of the common power supply;
    coupling a second sense node in the second sense module to at least a second storage element to sense a condition of the at least a second storage element, and converting an analog level at the second sense node to second digital data at a second time which is after the first time based on a level of the common power supply; and
    coupling the common power supply to the first storage element during a time period which includes the second time, while decoupling the first sense node from the at least a first storage element during the time period.

7. The method of claim 6, further comprising:
    coupling a respective charge storing component in the first sense module to the first sense node; and
    coupling a respective charge storing component in the second sense module to the second sense node.

8. The method of claim 6, wherein:
    the at least a first storage element is in a first NAND string which is coupled to a first bit line, and a respective conductive path couples the common power supply to the at least a first storage element via the first bit line.

9. The method of claim 6, wherein:
    the at least a first storage element is connected in series in a first set of storage elements; and
    the at least a second storage element is connected in series in a second set of storage elements.

10. The method of claim 6, wherein:
    the at least a first storage element comprises a first non-volatile storage element; and
    the at least a second storage element comprises a second non-volatile storage element.

11. The method of claim 6, wherein:
    the first sense module senses the condition of the at least a first storage element, and the second sense module senses the condition of the at least a second storage element, both as part of a read or verify operation.

12. The method of claim 6, wherein:
    the time period spans at least the first and second times.

13. The method of claim 6, further comprising:
    during the time period, coupling the common power supply to the second storage element via a respective conductive path in the second sense module while decoupling the second sense node from the at least a second storage element.

14. A method of controlling a storage system comprising a plurality of storage elements and associated sense modules, including a first set of storage elements and an associated first set of sense modules, and a second set of storage elements and an associated second set of sense modules, the method comprising;
    coupling a common power supply to the associated sense modules;
    instructing the first set of sense modules to provide, based on a level of the common power supply, and at a first time in a first time period, digital data which is indicative of respective states of the first set of storage elements, and to couple the common power supply to the first set of storage elements during the first time period; and instructing the second set of sense modules to provide, based on the level of the common power supply, and at a second time in the first time period which is after the first time, digital data which is indicative of respective states of the second set of storage elements.

15. The method of claim 14, wherein:

for each sense module of the associated first set of sense modules, the digital data which is indicative of respective states of the first set of storage elements is obtained by providing the common power supply and a level of a respective sense node as inputs to an analog-to-digital converter.

16. The method of claim 15, further comprising:

coupling each respective sense node of the associated first set of sense modules to a respective storage element in the first set of storage elements at the first time.

17. The method of claim 15, further comprising:

for each sense module of the associated first set of sense modules, coupling a respective charge storing component to the respective sense node.

18. The method of claim 17, further comprising:

in a second time period which precedes the first time period, instructing the associated first set of sense modules to couple the respective charge storing components to the respective storage elements of the first set of storage elements via the respective sense nodes, and to couple the common power supply to the first set of storage elements.

19. The method of claim 14, further comprising:

instructing the associated second set of sense modules to couple the common power supply to the second set of storage elements during the first time period.

20. The method of claim 14, wherein:

each storage element in the first and second sets of storage elements is provided in a respective NAND string.

21. The method of claim 14, wherein:

each storage element in the first and second sets of storage elements is provided in a respective series-connected chain of storage elements.

* * * * *